United States Patent
McKnight et al.

(10) Patent No.: US 10,062,727 B2
(45) Date of Patent: Aug. 28, 2018

(54) STRAIN RELIEVING DIE FOR CURVED IMAGE SENSORS

(71) Applicant: Microsoft Technology Licensing, LLC, Redmond, WA (US)

(72) Inventors: Geoffrey P. McKnight, Los Angeles, CA (US); Brian K. Guenter, Redmond, WA (US); Andrew Keefe, Encino, CA (US); Neel S. Joshi, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 27 days.

(21) Appl. No.: 15/393,187

(22) Filed: Dec. 28, 2016

(65) Prior Publication Data

US 2018/0076257 A1    Mar. 15, 2018

Related U.S. Application Data

(60) Provisional application No. 62/385,850, filed on Sep. 9, 2016.

(51) Int. Cl.
*H04N 5/372* (2011.01)
*H01L 27/146* (2006.01)
(Continued)

(52) U.S. Cl.
CPC ...... *H01L 27/14683* (2013.01); *G06T 3/4007* (2013.01); *H01L 21/304* (2013.01);
(Continued)

(58) Field of Classification Search
CPC .................................................... H04N 5/372
See application file for complete search history.

(56) References Cited

U.S. PATENT DOCUMENTS

| 5,349,443 A | 9/1994 | Guerra |
| 5,514,888 A | 5/1996 | Sano et al. |

(Continued)

FOREIGN PATENT DOCUMENTS

| EP | 1132967 | 9/2001 |
| EP | 2458638 | 5/2012 |
| JP | 2012182194 | 9/2012 |

OTHER PUBLICATIONS

"Notice of Allowance Issued in U.S. Appl. No. 14/491,903", dated Sep. 28, 2016, 8 Pages.
(Continued)

*Primary Examiner* — James Hannett
(74) *Attorney, Agent, or Firm* — Drinker Biddle & Reath LLP

(57) ABSTRACT

Techniques for fabricating a semiconductor die having a curved surface can include placing a substantially flat semiconductor die in a recess surface of a concave mold such that corners or edges of the semiconductor die are unconstrained or are the only portions of the semiconductor die in physical contact with the concave mold. The semiconductor die can include through-die cut lines that can lead to substantially less tension in the semiconductor die as compared to the case where the semiconductor die does not include through-die cut lines. Accordingly, such through-die cut lines can allow for achieving relatively large curvatures.

20 Claims, 10 Drawing Sheets

(51) Int. Cl.
*H01L 21/304* (2006.01)
*H04N 5/378* (2011.01)
*G06T 3/40* (2006.01)
*H04N 5/376* (2011.01)

(52) U.S. Cl.
CPC .. *H01L 27/14601* (2013.01); *H01L 27/14618* (2013.01); *H04N 5/372* (2013.01); *H04N 5/376* (2013.01); *H04N 5/378* (2013.01)

(56) References Cited

U.S. PATENT DOCUMENTS

| | | | |
|---|---|---|---|
| 6,255,025 | B1 | 7/2001 | Akutsu et al. |
| 6,285,400 | B1 | 9/2001 | Hokari |
| 6,312,959 | B1 | 11/2001 | Datskos |
| 6,451,670 | B1 | 9/2002 | Takisawa et al. |
| 6,706,448 | B1 | 3/2004 | Gole et al. |
| 6,762,510 | B2 | 7/2004 | Fock et al. |
| 6,791,072 | B1 | 9/2004 | Prabhu |
| 7,190,039 | B2 | 3/2007 | Boettiger et al. |
| 7,397,066 | B2 | 7/2008 | Oliver |
| 7,507,944 | B1 | 3/2009 | Amzen et al. |
| 7,626,621 | B2 | 12/2009 | Ito et al. |
| 7,696,588 | B2 | 4/2010 | Boettiger et al. |
| 7,714,437 | B2 | 5/2010 | Naya |
| 7,733,397 | B2 | 6/2010 | Lu et al. |
| 7,742,090 | B2 | 6/2010 | Street et al. |
| 7,923,793 | B2 | 4/2011 | Choi et al. |
| 8,124,519 | B2 | 2/2012 | Bone |
| 8,248,499 | B2* | 8/2012 | Sutton .................. G02B 3/0037 348/294 |
| 8,654,215 | B2* | 2/2014 | Sutton ............... H01L 27/14605 348/240.2 |
| 8,810,671 | B2 | 8/2014 | Winter |
| 8,836,805 | B2 | 9/2014 | Sutton et al. |
| 8,878,116 | B2 | 11/2014 | Itonaga |
| 9,490,285 | B2* | 11/2016 | Itonaga ............ H01L 27/14618 |
| 9,551,856 | B2* | 1/2017 | Gabriel .................. H04N 5/247 |
| 2001/0020671 | A1* | 9/2001 | Ansorge ............ H01L 27/14603 250/208.1 |
| 2003/0013280 | A1 | 1/2003 | Yamanaka |
| 2004/0133275 | A1 | 7/2004 | Mansmann |
| 2004/0229071 | A1 | 11/2004 | Jankosky et al. |
| 2005/0030408 | A1 | 2/2005 | Ito et al. |
| 2005/0035514 | A1 | 2/2005 | Hillman et al. |
| 2006/0186492 | A1 | 8/2006 | Boettiger et al. |
| 2006/0275941 | A1 | 12/2006 | Oliver et al. |
| 2007/0096235 | A1 | 5/2007 | Boettiger et al. |
| 2007/0222013 | A1 | 9/2007 | Lincoln et al. |
| 2008/0237443 | A1 | 10/2008 | Oliver et al. |
| 2009/0045510 | A1 | 2/2009 | Naya |
| 2009/0115875 | A1* | 5/2009 | Choi ................. H01L 27/14618 348/294 |
| 2009/0184954 | A1 | 7/2009 | Street |
| 2010/0025789 | A1 | 2/2010 | Imai et al. |
| 2010/0178722 | A1 | 7/2010 | de Graff et al. |
| 2011/0057284 | A1 | 3/2011 | Brodie |
| 2011/0163466 | A1 | 7/2011 | Taguchi et al. |
| 2011/0200883 | A1 | 8/2011 | Cui et al. |
| 2012/0002087 | A1 | 1/2012 | Kim |
| 2012/0147207 | A1 | 6/2012 | Itonaga |
| 2012/0159996 | A1 | 6/2012 | Sutton |
| 2012/0217606 | A1 | 8/2012 | Itonaga |
| 2012/0261551 | A1 | 10/2012 | Rogers |
| 2012/0299140 | A1 | 11/2012 | Sekine |
| 2013/0268490 | A1 | 10/2013 | Keebler et al. |
| 2013/0270662 | A1 | 10/2013 | Roy et al. |
| 2013/0312541 | A1 | 11/2013 | Majidi et al. |
| 2014/0004644 | A1 | 1/2014 | Roy et al. |
| 2014/0049683 | A1 | 2/2014 | Guenter et al. |
| 2014/0160327 | A1 | 6/2014 | Enoki et al. |
| 2014/0303452 | A1* | 10/2014 | Ghaffari .................. A61B 1/05 600/301 |
| 2015/0194585 | A1 | 7/2015 | Kim et al. |
| 2015/0334300 | A1 | 11/2015 | Gabriel et al. |
| 2016/0086987 | A1 | 3/2016 | McKnight et al. |
| 2016/0086994 | A1 | 3/2016 | Guenter |
| 2016/0240582 | A1 | 8/2016 | Yamamoto et al. |
| 2016/0268327 | A1 | 9/2016 | Lin et al. |
| 2016/0286102 | A1 | 9/2016 | Sulfridge et al. |
| 2017/0117311 | A1 | 4/2017 | McKnight et al. |
| 2018/0076336 | A1* | 3/2018 | De Graff .......... H01L 27/14692 |

OTHER PUBLICATIONS

"Final Office Action Issued in U.S. Appl. No. 14/491,928", dated Apr. 20, 2017, 17 Pages.

"Final Office Action Issued in U.S. Appl. No. 14/677,622", dated Jul. 20, 2017, 13 Pages.

"Final-Office Action Issued in U.S. Appl. No. 14/677,697", dated Dec. 28, 2016, 12 Pages.

"Non Final Office Action Issued in U.S. Appl. No. 15/398,266", dated Jun. 12, 2017, 16 Pages.

Office Action Issued in Colombian Patent Application No. NC2017/0002554, dated Apr. 6, 2017, 3 Pages.

"International Preliminary Report on Patentability Issued in PCT Application No. PCT/US2015/049276", dated Nov. 22, 2016, 9 Pages.

"International Preliminary Report on Patentability Issued in PCT Application No. PCT/US2016/025454", dated Mar. 20, 2017, 7 Pages.

"Notice of Allowance Issued in U.S. Appl. No. 14/677,697", dated Jun. 7, 2017, 7 Pages.

Office action for U.S. Appl. No. 14/677,622, dated Feb. 3, 2017, Keefe et al., "Bending Semiconductor Chip in Molds Having Radially Varying Curvature", 15 pages.

Cherng et al., "Fabrication of polydimethylsiloxane microlens array on spherical surface using multi-replication process", in the Journal of Micromechanics and Microengineering, vol. 24, No. 1, 2014, 10 pages.

Clarke, Peter "Sony Curves Images Sensors & TSMC Stacks Them", retrieved on Jul. 30, 2014, available at «http://www.eetimes.com/document.asp?doc_id=1321841», EE Times, Apr. 9, 2014, 2 pages.

Guvendiren et al., "Swelling-Induced Surface Patterns in Hydrogels with Gradient Crosslinking Density", In the Journal of Advanced Functional Materials, vol. 19, Iss. 19, Oct. 9, 2009, 9 pages.

PCT Search Report & Written Opinion for Application No. PCT/US2015/049276, dated Dec. 10, 2015, 13 pages.

Itonaga, "A Novel Curved CMOS Image Sensor Integrated with Imaging System", in the Proceedings of the Symposium on VLSI Technology (VLSI-Technology): Digest of Technical Papers, Jun. 19, 2014, 2 pages.

Iwert et al., "First results from a novel curving process for large area scientific imagers", In the Journal of International Society of Optics and Photonics, SPIE Astronomical Telescopes+, 2012, 14 pages.

Mokwa et al., "CMOS Transistors under Uniaxial Stress on Ultra-Thin Chips for Applications in Bendable Image Sensors", In the Proceedings of the 2012 8th Conference on Ph.D. Research in Microelectronics and Electronics (PRIME), Jun. 12, 2012, 4 pages.

Office Action for U.S. Appl. No. 14/491,928, dated Oct. 5, 2016, Guenter, "Image Sensor Bending Using Tension", 13 pages.

Office Action for U.S. Appl. No. 14/677,622, dated Nov. 2, 2016, Keefe et al., "Bending Semiconductor Chip in Molds Having Radially Varying Curvature", 12 pages.

Office Action for U.S. Appl. No. 14/491,903, dated Feb. 17, 2016, McKnight et al., "Image Sensor Bending by Induced Substrate Swelling", 10 pages.

Office Action for U.S. Appl. No. 14/491,903, dated May 5, 2016, McKnight et al., Image Sensor Bending by Induced Substrate Swelling, 12 pages.

Office Action for U.S. Appl. No. 14/677,622, dated Jun. 2, 2016, Keefe et al., "Bending Semiconductor Chip in Molds Having Radially Varying Curvature", 8 pages.

Office Action for U.S. Appl. No. 14/677,697, dated Jun. 30, 2016, Keefe et al., "Free-Edge Semiconductor Chip Bending", 9 pages.

PCT Search Report & Written Opinion for PCT Application No. PCT/US2016/025453, dated Jul. 1, 2016, 10 pages.

(56) References Cited

OTHER PUBLICATIONS

PCT Search Report & Written Opinion for PCT Application No. PCT/US2016/025454, dated Jul. 4, 2016, 11 pages.
The PCT Written Opinion of the International Preliminary Examining Authority dated Aug. 4, 2016 for PCT application No. PCT/US2015/049276, 7 pages.
PCT Search Report & Written Opinion for PCT Application No. PCT/US2015/049277, dated Nov. 26, 2015, 10 pages.
Rehm, "Apple patent describes use of curved image sensor to design small camera module", available at: «https://www.dpreview.com/articles/8027168176/apple-patent-describes-use-of-curved-image-sensor-to-design-small-camera-module», Jan. 28, 2016, 7 pages.
Sanyal, "Sony's curved sensors may allow for simpler lenses and better images", available at: «https://www.dpreview.com/articles/2279255612/sony-s-curved-sensors-may-allow-for-simpler-lenses-and-better-images», Jun. 18, 2014, 20 pages.
Shao et al., "Synthesis Surface Effects on the Stress and Deformation of Film/Substrate System", in the Journal of Applied Surface Science, vol. 257, Iss. 23, Sep. 15, 2011, 6 pages.
"Sony Unveils Curved Sensor-Technology" retrieved on Jan. 23, 2015 at «http://petapixel.com/2014/04/02/sony-unveils-curved-senor-technology/», 8 pages.
Tekaya et al, "Mechanical Behavior of Flexible Silicon Devices Curved in Spherical Configurations", in the Proceedings of the 14th International Conference on Thermal, Mechanical and Multi-Physics Simulation and Experiments in Microelectronics and Microsystems, Apr. 14, 2013, 7 pages.

\* cited by examiner

STRAIN RELIEVING DIE FOR CURVED IMAGE SENSORS

PRIORITY APPLICATION

This patent application claims the benefit of and priority to U.S. Provisional Patent Application Ser. No. 62/385,850, filed on Sep. 9, 2016, the entire disclosure of which is incorporated by reference herein.

BACKGROUND

Optical systems are commonly used in many devices, such as cameras, telescopes, binoculars, office equipment, and scientific instruments, just to name a few examples. Performance of optical systems hinges, in part, on the design of each of the elements of the system as well as the overall design of the system, which sets forth the optical interaction among the elements.

SUMMARY

This disclosure describes techniques and architectures for bending and shaping semiconductor dies, such as photonic sensors. In particular, a photonic sensor fabricated from a flat, relatively brittle material, such as silicon or gallium nitride, for example, can be shaped after the photonic sensor is fabricated, so that the light-sensitive surface of the photonic sensor is curved to have a spherical, aspheric, or other shape.

In some examples, a curved semiconductor die, which includes relatively few and small die cuts, is subjected to in-plane strain to allow for relatively high die curvature. Compared with processes involving larger die cuts, such an in-plane strain process can lead to less waste of silicon and can allow for placement of circuitry for general row/column addressing of an image sensor on the semiconductor die. The semiconductor die can be placed in a concave mold so that edges or corners of the semiconductor die are not rigidly constrained. In some implementations, the edges or corners can be the only portions of the semiconductor die in contact with the concave mold. The edges or corners are able to move or slide on the surface of the concave mold as the semiconductor die is bent into the shape of the concave mold. The semiconductor die can include through-die cut lines that can lead to substantially less tension in the semiconductor die as compared to the case where the semiconductor die does not include through-die cut lines. Accordingly, such through-die cut lines can allow for achieving higher local curvature.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The term "techniques," for instance, can refer to fabricating equipment, control system(s), method(s), computer-readable instructions, module(s), algorithms, or hardware logic (e.g., Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs)), which can be used to perform the technique(s) as permitted by the context above and throughout the document.

BRIEF DESCRIPTION OF THE DRAWINGS

The detailed description is set forth with reference to the accompanying figures. In the figures, the left-most digit of a reference number identifies the figure in which the reference number first appears. The use of the same reference numbers in different figures indicates similar or identical items or features.

DETAILED DESCRIPTION

Overview

Figure 1:
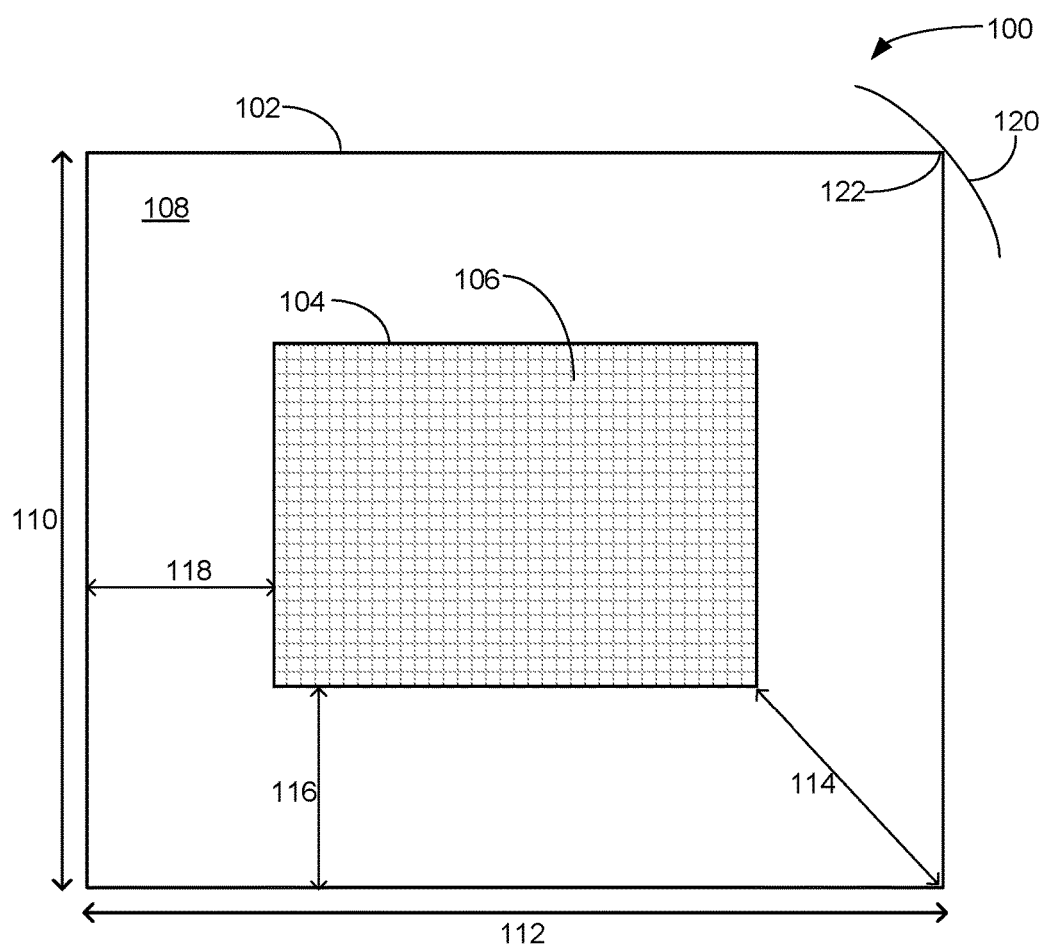
FIG. 1 is a top view of an example photonic sensor die.

Some examples described herein include a semiconductor imaging die configured to allow the die to take the form of a relatively highly curved three-dimensional surface having spherical or nearly spherical curvature. Such a semiconductor die can include slits cut (or etched or otherwise produced) entirely through the die such that in plane or membrane strain is relieved during a bending process so that higher curvatures can be achieved.

In some examples, four stress-relieving cuts or slits in a die that are substantially parallel to x and y axes of the die effectively partition the die into four regions, which can each be accessed using conventional row-column addressing. Within each region an electrical layout of the die may be essentially identical to that of a conventional image sensor. In contrast, cuts in a die that are not parallel to x and y axes may require substantial changes to sensor design and electrical wiring layout. For example, more than four cuts may require such significant changes.

Without slits, the maximum achievable curvature can be limited by the in plane strength of the semiconductor which in turn is limited by a flaw distribution and critical fracture toughness of the specific sensor materials. While in theory a semiconductor die can be cut with many through cuts in arbitrary directions to help conform to a curved surface, this approach may be undesirable from the standpoint of the readout circuit that addresses each individual sensor pixel. Most current readout circuits use rectilinear row column readouts that scale well to small pixels sizes. Any high performance sensor is likely compatible with this approach. To create a precision, highly curved sensor with only rectilinear cuts likely requires significant stretching and precisely-designed cuts to create a seamless, highly curved sensor die. Thus, a curved die surface can be achieved by a combination of stretching and rigid body displacements with a slit geometry designed to be compatible with microcircuit design and fabrication techniques. This approach can provide a readily manufacturable design that is compatible with existing and on-going improvements to imaging sensors including back side illumination, active pixel readouts, and digital pixel imagers. The approach can be adapted to CCD imagers and CMOS imagers, just to name a few examples. The approach can be applied to various imaging system sizes (e.g., sensor sizes ranging from small ⅓" sensors up to large full frame 35 mm cameras). The design for any specific sensor can be matched to a specific radius of curvature host surface (e.g., mold).

To address limited strain capacity of semiconductor materials, examples described herein involve cuts into semiconductor die to accommodate required stretching strains in moving from a flat sheet to a curved surface. The cuts effectively replace the hoop strain required to stretch a flat sheet into a two degree of curvature surface with edge displacements. A relatively small edge displacement can significantly increase the degree of spherical curvature that can be achieved for a given material strain capacity.

In some examples, the shape of such cuts can be such that, in a final curved state, a prescribed (possibly minimized or near-zero or subpixel) gap can be introduced between adjacent sides of the cuts. Due to stretching of the semiconductor die in middle areas during forming, the shape cannot be derived geometrically, and instead can be determined through computer simulation (i.e. finite element analysis).

Generally, optical systems can comprise lenses, mirrors, and/or one or more light sensing devices, such as charge-coupled device (CCDs) or other devices that can convert light energy into electrical signals. A plurality of CCDs can be configured in an array (e.g. a pixelated array) fabricated on a substrate, which can be silicon, germanium, or other semiconductor material, for example. A light-sensitive device, such as a CCD, an array of CCDs, or one or more other light sensing entities in any number of configurations, fabricated on a substrate is herein called a "photonic sensor die." This name can refer to a light sensor that need not be configured to sense an image, but rather any electromagnetic signal (visible or not).

A photonic sensor die can be in a bent shape so that the light-sensitive surface of the photonic sensor die has a curved shape, which can provide a number of advantages to the design of an optical system, as compared to a flat-surface photonic sensor die. In particular, optical systems comprising lenses and/or mirrors can have fewer design constraints or improved performance characteristics when the optical systems include a curved photonic sensor die, as compared to a flat-surface photonic sensor die. For example, some design constraints can include number of lenses, acceptable tolerances for chromatic and/or spatial aberrations, and so on. A photonic sensor die having a spherical, aspheric, or other surface can lead to a high performance optical system that produces a relatively uniform light intensity and spatial frequency response across the surface of the photonic sensor die.

Herein, a semiconductor die can include a photonic sensor die, a substrate that includes micro-circuitry, or an unprocessed substrate. A semiconductor die can comprise any of a number of materials, such as indium gallium arsenide, germanium, silicon, lead sulfide, indium arsenide, mercury cadmium telluride, and platinum silicide, just to name a few examples. In some examples, a process for bending a flat semiconductor die (e.g., chip) into a curved (e.g., spherical) mold allows the edges or corners of the die to be able to slide on the surface of the mold. This is in contrast to bending processes that constrain edges or corners of a semiconductor die to be rigidly fixed so that the edges or corners cannot move during bending. As the semiconductor die bends under an applied force, the semiconductor die stores mechanical energy, leading to stresses that can fracture the semiconductor die during the bending process. By allowing edges or corners of the semiconductor die to be able to slide on the surface of the mold, such stored stresses are reduced, which allows for greater deflections (e.g., greater bending) as compared to the case where the edges or corners are fully constrained (e.g., fixed edges). In the case of fixed edges, forming loads induce membrane tension in the semiconductor die, reducing bending deflection, and increasing the overall internal stress state for a given deflection or radius of curvature of the semiconductor die. For example, a 25 micron thick die can become difficult to deform beyond about 50-75 microns of center deflection due to tension-carrying loads among edge supports. In contrast, allowing the edges or corners of the die to be able to slide can lead to more than about 150 microns of center deflection.

In various examples, a semiconductor die, such as a photonic sensor die, can include through-die cut lines that can extend inward from an edge of the die. Such through-die cut lines, hereinafter referred to as "cut lines", can help to relieve stresses and strains in the die during and subsequent to the die being bent into a curved (e.g., concave or convex) shape.

In various examples, a semiconductor die, such as a photonic sensor die, can be bent in a process that includes placing the semiconductor die, including one or more cut lines, on a recessed surface of a concave mold such that corners or edges of the semiconductor die are the only portions of the semiconductor die in physical contact with the recessed surface. Herein, a "concave mold" can include portions that are not concave. In other words, a concave mold can include portions that are not concave but instead have any of a number of other shapes (e.g., one portion of a concave mold can be convex or flat while another portion is concave). In the case where the semiconductor die is rectangular and the recessed surface has a circular or elliptical cross section, the corners of the semiconductor die are the only portions of the semiconductor die in physical contact with the recessed surface. In the case where the semiconductor die is circular and the recessed surface has a circular cross section, the edge (e.g., perimeter) of the semiconductor die is the only portion of the semiconductor die in physical contact with the recessed surface. In other words, the area of the circular semiconductor die is suspended over the recessed surface of the concave mold, while the perimeter of the circular semiconductor die rests on the recessed surface, as described below. Hereinafter, for sake of clarity, "edges" is used to indicate an edge, edges, or corners of a semiconductor die, whether the semiconductor die is rectangular, circular, oval, or other shape.

In various other examples, a semiconductor die can be bent in a process that includes placing the semiconductor die over a recessed surface of a mold such that corners or edges of the semiconductor die are not rigidly constrained (e.g., not clamped or held in place) and are free to move as force applied to the semiconductor die deflects the semiconductor die. In some cases, a peripheral portion (which need not include corners or edges) of the area of the semiconductor die can slide on the surface of the mold while a central portion (e.g., which includes an active region of the semiconductor die) is pushed at least partially into the recessed surface of the mold. During this time, corners or edges of the semiconductor die, not being rigidly constrained, can move in any number of directions. For example, as the central portion of the semiconductor die is pushed downward, corners or edges can rotate upward, away from the surface of the mold and/or move inward toward the portion of the mold that includes the recessed surface.

The edges of the semiconductor die are not rigidly constrained and are substantially free to slide inward on the recessed surface of the concave mold. The edges can slide inward while the semiconductor die is pushed downward into the recessed surface during a process of bending the semiconductor die. For example, bending the semiconductor die to form a concave shaped semiconductor die can be performed by applying a force on the semiconductor die, toward the bottom of the concave mold. This force can be applied substantially uniformly across the area of the semiconductor die. For example, a force applied across the area can have some variation but has a substantial uniformity so that the force uniformity is adequate to deform a semiconductor die from being substantially flat to a desired curvature. While applying such a force, the semiconductor die bends and the center of the semiconductor die displaces downward. A fraction of the tension required to achieve a degree of center displacement can be reduced by permitting the edges of the semiconductor die to slide inward on the recessed surface of the concave mold. As mentioned above, such sliding occurs because the edges are not physically constrained to maintain their position. As described in further detail below, an appropriate amount of friction, which can vary during a process of bending the semiconductor die, exists between the edges of the semiconductor die and the recessed surface of the concave mold. The friction provides control over the level of tension during the bending process and increases the elastic stability of the semiconductor die, preventing out-of-plane buckling of the semiconductor die (e.g., comprising relatively thin silicon) caused by in-plane compressive forces. Uncontrolled out-of-plane buckling can lead to wrinkles in the semiconductor die and subsequent catastrophic failure if the die exceeds its failure strains.

In various examples, the combination of a curved photonic sensor die bonded to a mold that was used to shape the photonic sensor die can comprise a stand-alone optical device that can be subsequently incorporated into optical systems. For example, a manufacturer can fabricate an optical device comprising the combination of a curved photonic sensor die bonded to a substrate. The manufacturer can supply such an optical device to another manufacturer that produces optical systems. The optical device can be incorporated into such optical systems.

Various examples are described further with reference to FIGS. 1-21.

Example Environment

FIG. 1 is a top view of an example photonic sensor die 100. Examples of techniques and apparatuses described herein can be applied to semiconductor dies and are not limited to bending photonic sensor dies. For illustrative purposes, however, examples and implementations described below involve photonic sensor dies. It should be noted that any of a number of other types of semiconductor dies can be shaped or bent using the example techniques and implementations.

In examples described herein, photonic sensor die 100 can include one or more cut lines that are not illustrated in FIG. 1 for clarity. Cut lines are described below and illustrated in following figures.

Photonic sensor die 100 includes a semiconductor substrate 102 upon which a light-sensitive portion 104 is built. Light-sensitive portion 104, which can be a CCD array, for example, includes one or more light-sensitive elements 106. Each such light-sensitive element 106, for example, can correspond to a pixel of an image produced, in part, by light-sensitive portion 104. Light-sensitive portion 104 can be referred to as an "active region", which is capable of converting light energy to electrical energy or electrical signals. Unless otherwise noted, the term "light" refers to electromagnetic energy in any portion of the spectrum. Thus, for example, light or light energy encompasses visible, infrared (IR), near-infrared (NIR), and ultraviolet (UV) portions of the electromagnetic spectrum.

An inactive region 108 can at least partially surround light-sensitive portion 104. Inactive region 108, which can be void (or substantially void) of light-sensitive elements, can include various circuit elements, conductive traces, and so on for operating light-sensitive portion 104. For example, if light-sensitive portion 104 is a CCD array, inactive region 108 can include circuitry for controlling rows and columns of the CCD elements. Each of light-sensitive portion 104 and inactive region 108 can occupy any portion of the area of photonic sensor die 100. Light-sensitive portion 104 may, for example, be square or rectangular (or other shape) having any aspect ratio (e.g., width-to-height). Width 110 or length 112 of photonic sensor die 100 can be in a range from about 5 millimeters up to about 35 millimeters, though claimed subject matter is not limited in this respect. In a particular example implementation, distances 114-118 from edges of light-sensitive portion 104 to edges of corners of semiconductor substrate 102 can be in a range from about 1% up to about 50% of width 110 or length 112. A portion of a mold surface 120 is illustrated to indicate that a corner 122 of flat photonic sensor die 100 can be placed on the mold surface, while other portions of the photonic sensor die are not in contact with the mold surface, as described below.

Semiconductor substrate 102 can comprise any number of elements, including combinations of such elements, any of which can include added impurities (e.g., dopants). For example, semiconductor substrate 102 can be silicon or germanium. In some examples, thickness of photonic sensor die 100 can range from about 5 to 10 microns up to about 50 microns.

Photonic sensor die 100, which can be flat or curved, can be incorporated into an optical system that provides light in a particular fashion to photonic sensor die 100. For example, in some implementations, a lens system can be configured to have a focal plane that coincides with the location of photonic sensor die 100. In a particular implementation, a lens system can be configured to have a focal surface that coincides with the curved surface of a curved version of photonic sensor die 100. In other implementations, a lens system can be configured to have a focal length that coincides with the focal length of photonic sensor die 100. Optical elements (e.g., lenses and/or mirrors) of the optical system can at least partially determine the location of a focal plane and a focal length. In particular, a portion of an optical system that provides light to light-sensitive portion 104 can be designed based, at least in part, on particular details of light-sensitive portion 104, such as the size of light-sensitive portion 104, the resolution of light-sensitive portion 104, and the positioning of light-sensitive portion 104 with respect to the remainder of the optical system. Performance of optical systems depends, at least in part, on the design of each of the optical elements of the optical system as well as the overall design of the optical system, which sets forth the optical interaction among the optical elements. For example, light output of one lens can be the light input of a subsequent lens. Generally, quality of the optical elements and their arrangement with respect to one another increases as resolution (e.g., density of light-sensitive elements 106, such as CCD elements that correspond to pixels) increases. For example, such quality can be based, at least in part, on parameters of the individual optical elements, including, but not limited to, structural and optical aberrations, optical transmission or reflection, light uniformity, positioning, and so on.

Figure 2:
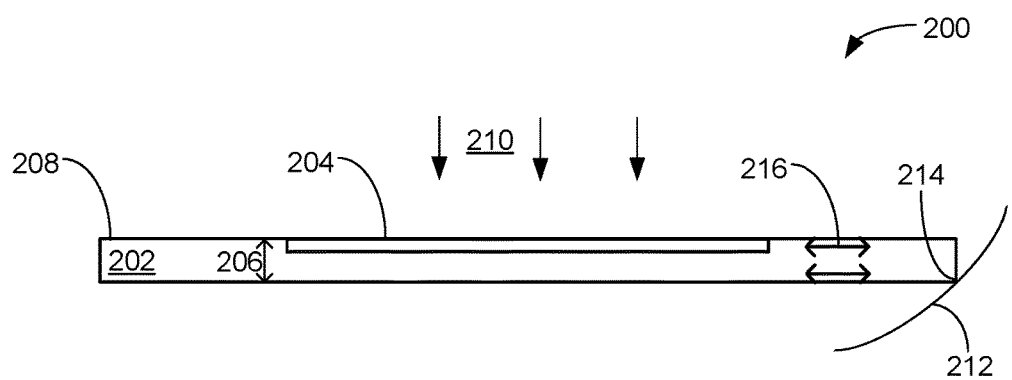
FIG. 2 is a cross-section view of an example photonic sensor die.

FIG. 2 is a cross section view of an example photonic sensor die 200. Photonic sensor die 200 can be the same as or similar to photonic sensor die 100, illustrated in FIG. 1. Photonic sensor die 200 includes a semiconductor substrate 202 upon which an active region 204 is built. In some implementations, substrate 202 can have a thickness 206 ranging from about 5 to 10 microns up to about 50 microns.

Active region 204 includes one or more light-sensitive elements, such as 106 illustrated in FIG. 1. An inactive region 208 can at least partially surround active region 204. Inactive region 208, which can be void of light-sensitive elements, can include various circuit elements, conductive traces, and so on for operating active region 204. Each of active region 204 and inactive region 208 can occupy any portion of the area of photonic sensor die 200. Photonic sensor die 200 can be positioned or arranged to receive light 210 on at least a portion of active region 204. A portion of a mold surface 212 is illustrated to indicate that a corner 214 of flat photonic sensor die 200 can be placed on the mold surface, while other portions of the photonic sensor die are not in contact with the mold surface, as described below.

In some examples, semiconductor substrate 202 can be subjected to in-plane strain by, at least in part, forces (not illustrated in FIG. 2) applied onto the semiconductor substrate 202. Such in-plane strain can allow for relatively high die curvature while involving relatively few and small die cuts. Compared with processes involving larger die cuts, such an in-plane strain process can lead to less waste of silicon and can allow for placement of circuitry for general row/column addressing of an image sensor on the semiconductor die. In-plane strain can be manifested as compressive or tensile forces (or stresses or strains) across thickness 206, as indicated by arrows 216. For example, in-plane strain can stretch semiconductor substrate 202 by maintaining tensile stress through entire thickness 206. As a counter example, a folding action of a substrate can involve compressive stresses on one side of the substrate and tensile stresses on the other side of the substrate (and no stresses somewhere in the interior of the substrate). Processes for stretching and forming a semiconductor die, such as semiconductor substrate 202, are illustrated below, for example. Such processes can avoid a combination of compressive stress and tensile stress in a cross-section of the semiconductor die, thereby relying on one or the other type of stress to stretch and form the semiconductor die.

Figure 3:
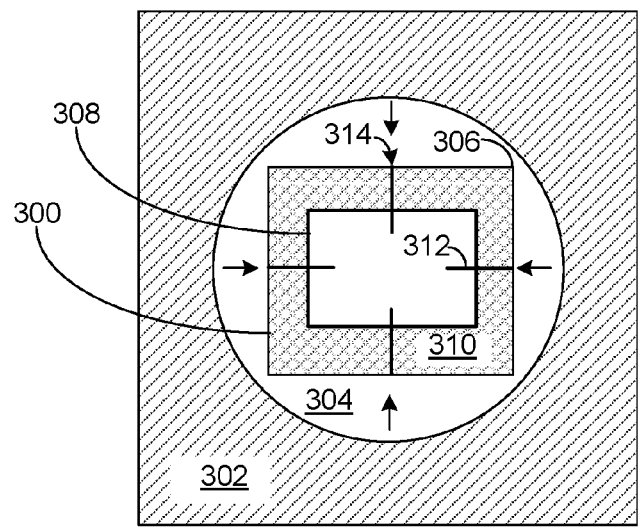
FIG. 3 is a top view of an example semiconductor die in a concave mold.

FIG. 3 is a top view of an example semiconductor die 300, such as a photonic sensor die, placed on a recessed surface of a concave mold 302. Examples described herein involve concave molds having shapes that can be spherical, parabolic, aspheric, or a compound shape having one or more inflection points, just to name a few examples.

Concave mold 302 includes a recessed surface 304 having a surface that slopes downward, as indicated by arrows in FIG. 3, toward a bottom of recessed surface 304. Due at least in part to geometry of a flat rectangle (e.g., semiconductor die 300) in an ellipsoid or spherical surface (e.g., recessed surface 304), corners 306 of semiconductor die 300 are the only portions of semiconductor die 300 in contact with the surface of recessed surface 304.

Semiconductor die 300 includes active region 308 and inactive region 310. Cut lines 312 (four are illustrated in FIG. 3) extend inward from edges 314, through inactive region 310 and at least partially into active region 308. In other examples, however, cut lines need not extend into active region 308.

Figure 4:
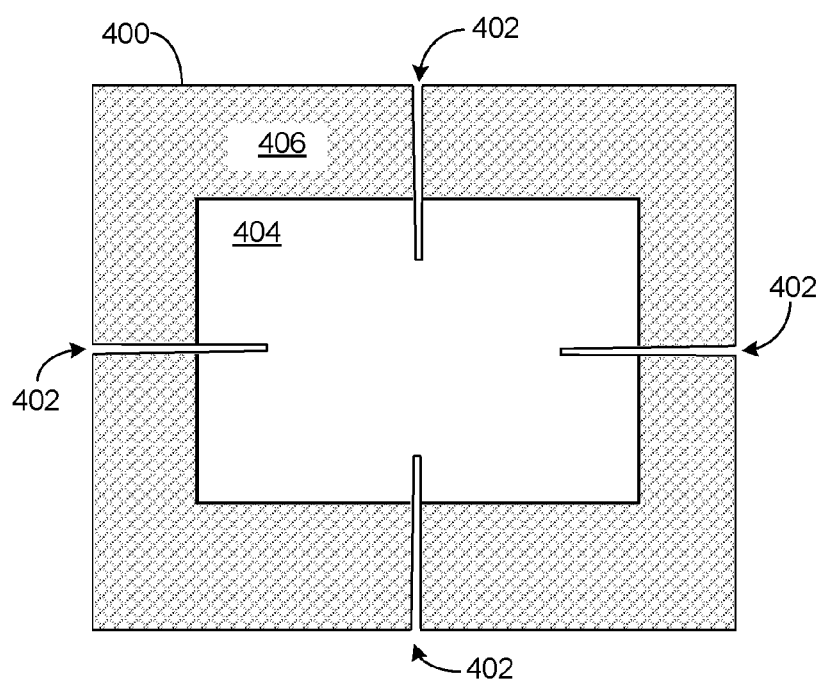
FIG. 4 is a top view of an example semiconductor die that includes through-die cut lines.

FIG. 4 is a top view of an example semiconductor die 400 that includes through-die cut lines. For example, semiconductor die 400 can be the same as or similar to semiconductor die 300 illustrated in FIG. 3. Semiconductor die 400 is substantially flat, having not yet been involved in a process of bending or curving by concave mold 302, for example. Semiconductor die 400 includes active region 404 and inactive region 406. Cut lines 402 can comprise a gap that penetrates through the entire thickness of the semiconductor die (e.g., into the image of the drawing of FIG. 4). In some examples, cut lines can have a width that is a fraction of a percent (e.g., about 0.25% to about 0.5%) of the width of the semiconductor die. In a particular example, for a square die having a width/length of 8.0 millimeters (mm), cut lines can extend inward from the edge of the die by about 2.5 mm.

Figure 5:
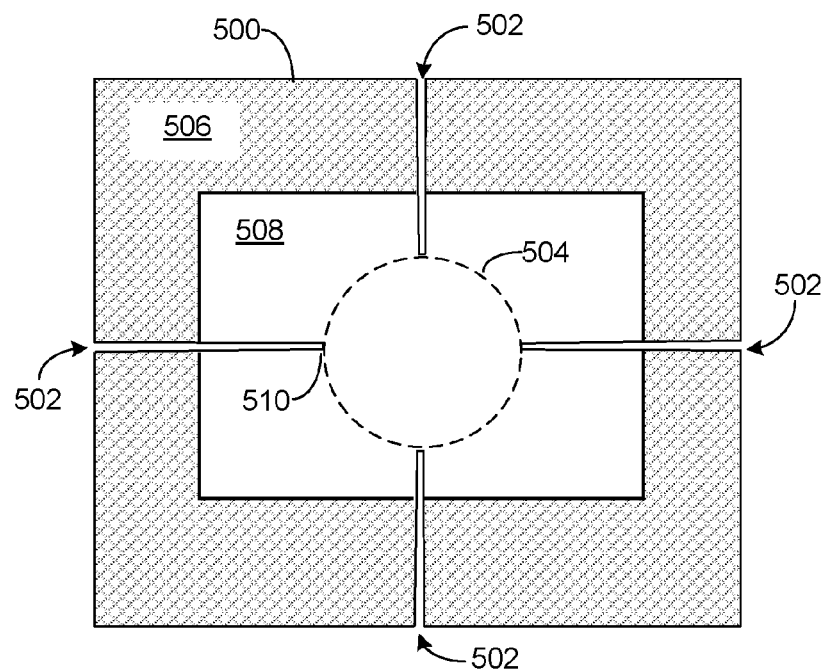
FIG. 5 is a top view of an example semiconductor die that includes through-die cut lines that terminate at a center radius.

FIG. 5 is a top view of an example semiconductor die 500 that includes through-die cut lines 502 that terminate at a center radius 504. Semiconductor die 500 is similar to or the same as semiconductor die 400, except that cut lines 502 extend inward from edges of semiconductor die 500, through inactive region 506 and into active region 508 at the periphery of center radius 504. Terminating cut lines 502 at a terminus 510 at a center radius leads to an uncut central portion of the die. In some examples, active region 508 (e.g., the sensor area of the die) can comprise a central portion that is surrounded by microelectronic components on its periphery. Such components can remain contiguous within an area inside center radius 504. In such a case, this inside region can be left entirely uncut (e.g., no cut lines in this region) to prevent gaps in an imaging plane of the active region, for example. In other embodiments, cut lines can enter into the active region and into the area within center radius 504. In this case, it may be desirable to include cut lines 502 having a relatively small gap, such as less than one pixel width, after bending. Pixel pitch can vary substantially depending, at least in part, on sensor size and type. Pixels can range from about 1.2 microns to about 25 microns in length, for example.

Figure 6:
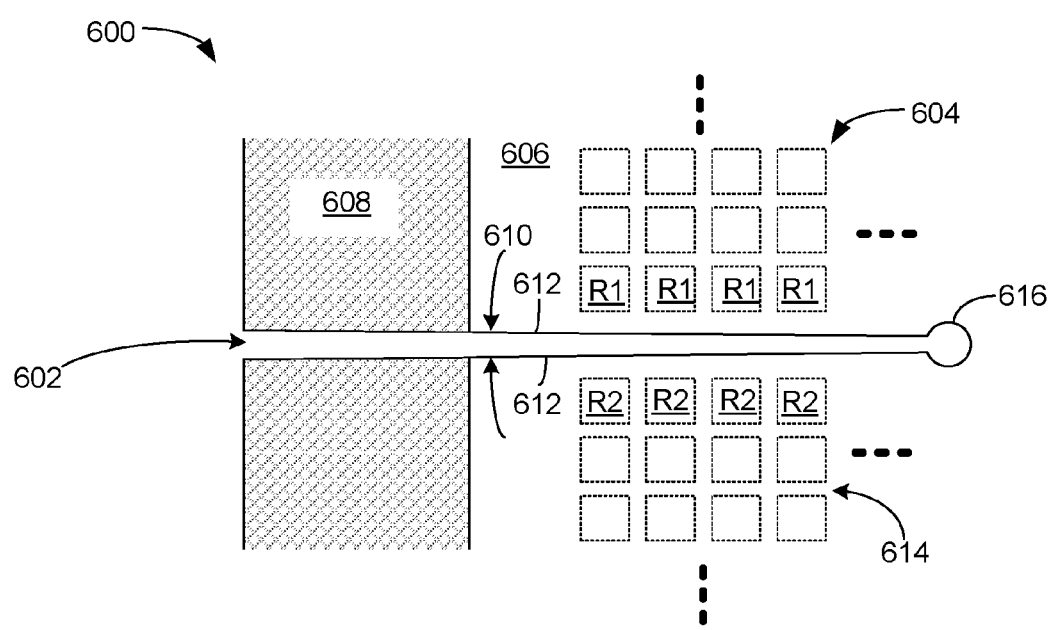
FIG. 6 is a top close-up view of a portion of an example semiconductor die that includes a through-die cut line and adjacent pixels.

FIG. 6 is a top close-up view of a portion of an example semiconductor die 600 that includes a cut line 602 and an array of pixels 604 fabricated on the die. Semiconductor die 600 is similar to or the same as semiconductor die 400, for example. Semiconductor die 600 includes an active region 606, which includes pixels 604, and a non-active region 608, which can include electrical control (e.g., data) lines (not illustrated in FIG. 6) for conveying electrical signals from pixels 604 to electronics external to semiconductor die 600.

Such control lines can be configured for row-column addressing of pixels 604. In contrast, some curved semiconductor dies can involve relatively complicated addressing circuitry and addressing schemes due to relative locations of pixels and other geometrical constraints. Pixels 604 can be light sensing devices, such as CCDs or other devices that can convert light energy into electrical signals. In some examples, pixels 604 can be arranged in rows and columns. To aid in the following discussion, one row of pixels adjacent to cut line 602 is labelled R1 and a row of pixels on the other side of the cut line is labelled R2.

The gap 610 of cut line 602 has a width profile 612, which, in a top or plan view (as in FIG. 6), is the outline or edge of cut line 602. Width profile 612 is configured so that the gap closes or at least narrows as semiconductor die 600 is bent into a predetermined three-dimensional profile, such as by the shape of the recessed surface of concave mold 302, for example. Generally, because of geometries involved with bending a flat substrate into a three-dimensional shape, as well as considerations involving physical stretching of the substrate, width profile 612 can have an outline that is not linear, so that the gap substantially closes along the length of cut line 602. In some examples, the cut lines for the substrate in a flat state are based on a calculation that takes into account the substrate's diameter or surface profile (e.g., before and after bending), the lateral dimension of the substrate, the thickness of the substrate, and the loads applied during the forming or bending process. Because substantial stretching (e.g., elastic strains) can occur with a substrate (e.g., with or without cut lines) while bending into a curved geometry, the end location of the edge of the substrate can vary substantially depending on the location of the cut line and the center terminus (e.g., 510). In some examples, a finite element calculation can be performed to determine a width profile of the cut line. In such a case, the cut line can be represented by a curve-fit approximation having a polynomial form, $y(x)=ax+bx^2+cx^3+\ldots$, where a, b, c, are real number coefficients and x and y are coordinates in a coordinate system (e.g., having x- and y-axes).

As described above, as bending of substrate 600 occurs, gap 610 decreases. During such decreasing, distances decrease between pixels on one side of gap 610 and the other side of the gap. For example, relative distance between pixels R1 and pixels R2 decreases. In some cases, the final distance between pixels R1 and pixels R2, subsequent to bending, cannot be as small as regular spacings 614 between other rows of pixels in the array. In these cases, an image resulting from pixels 604 can be generated, in part, by interpolating electrical signals among pixels of rows R1 and R2. Such interpolation can substantially compensate for the larger-than-regular spacing between rows R1 and R2 due to the presence of cut line 602 (which cannot be completely closed after final bending of the substrate). Such larger-than-regular spacing between rows R1 and R2 can also result from a predetermined area of the substrate adjacent to cut line 602 that is intentionally kept clear of pixels so as to create a setback from the cut line. Such a setback allows for consideration of fabrication tolerances (e.g., accuracy of locating cut line 602 relative to pixel positions), as described in further detail below.

In some examples, a terminus of cut line 602 can include a stress relief feature 616 at the inner end of cut line 602. Stress relief feature 616 can have an outline of a circle or can have any of a number of other profiles that increase the radius of curvature at the end of the cut from a sharp feature to a more rounded curve. The diameter of a circle, for example, can be selected to help ensure that stress concentrations that develop during a shaping process do not exceed the strength of the material of the substrate. Such a diameter can be, for instance, 0.100 mm. Larger circles will generally provide a greater reduction in stress concentration, but can leave some areas of the active region with missing coverage (e.g., areas of the active region void of pixels 604). As described above, such missing pixels can be interpolated using neighboring pixels. The size of stress relief feature 616, however, can be relatively small to keep the amount of pixel interpolation relatively low.

Figure 7:
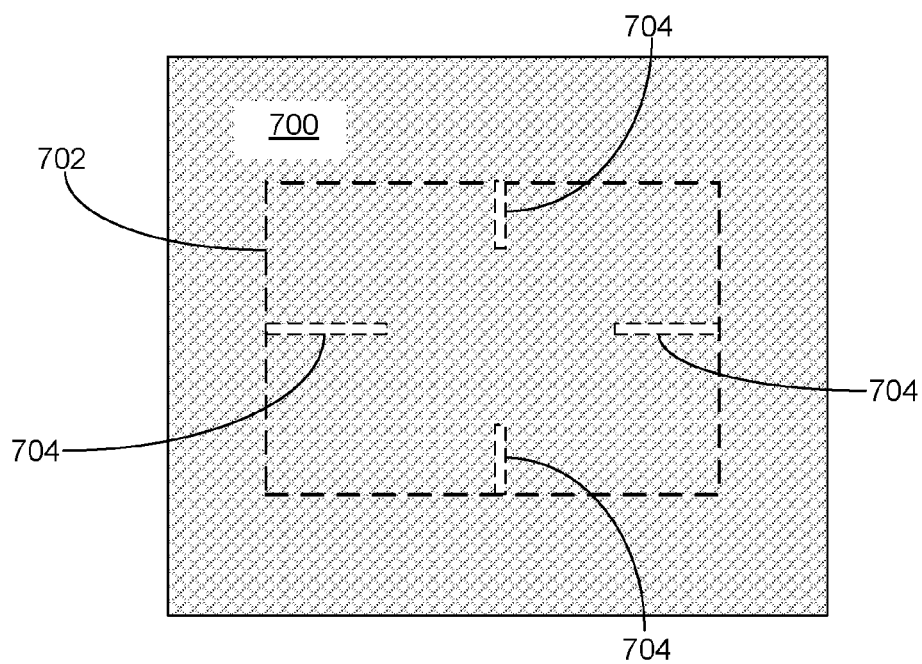
FIGS. 7-9 are top views of an example semiconductor die at different times in a process of being fabricated to include active regions and through-die cut lines.

FIG. 7 is a top view of an example semiconductor die 700 prior to a process of being fabricated to include active regions and through-die cut lines. Area 702 corresponds to an active region where pixels are to be fabricated. Generally, rows and columns of pixels (e.g., pixels 604) will occupy area 702. To account for cut lines that will later be formed in semiconductor die 700, however, setback areas 704 are established to demarcate areas where pixels are not to be fabricated. Widths of setback areas can be of the order of several pixels' width.

Figure 8:
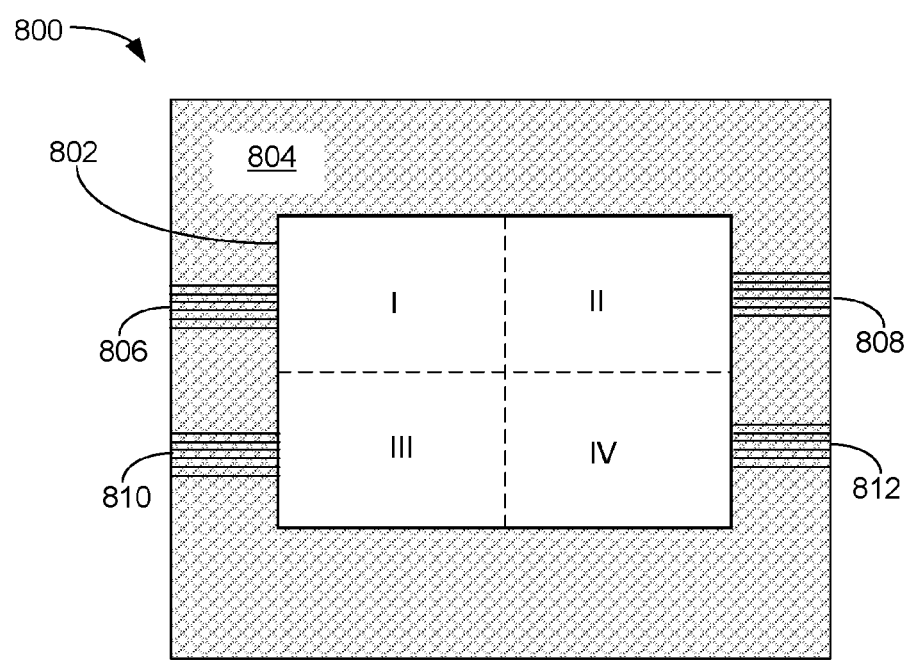

FIG. 8 is a top view of an example semiconductor die 800 illustrating a number of features. Semiconductor die 800 is similar to or the same as semiconductor die 700, for example. Semiconductor die 800 includes an active region 802 and an inactive region 804. Pixels (e.g., such as pixels 604) occupy active region 802 (except for setback areas, such as 704, illustrated in FIG. 7). In the particular example, of FIG. 8, the pixels in active region 802 can be electronically configured into four regions (though a configuration can have any number of regions) labelled as I, II, III, and IV. Pixel data lines (or control lines in the case of a display device where pixels can be display pixels) that convey electronic signals between pixels and electronics external to semiconductor die 800 can be dedicated to respective regions. Such data or control lines can be configured for a row-column addressing scheme. For example, signals from/to pixels in region I can be conveyed by conductors 806, signals from/to pixels in region II can be conveyed by conductors 808, signals from/to pixels in region III can be conveyed by conductors 810, and signals from/to pixels in region IV can be conveyed by conductors 812. Such fragmentation of conductors for pixels of the active region take into account cut lines that will at least partially separate pixel regions I, II, III, and IV from one another. In other words, conductors cannot cross cut lines so pixels of the active region can be wired so that conductors avoid the cut lines. Though pixels can be configured (or wired) in multiple and separate regions, external electronics can be configured to produce a single contiguous image. Moreover, the external electronics can use a row-column access or addressing via conductors 806, 808, 810, and 812.

In some examples, cut lines can be perpendicular to the perimeter of the substrate. This approach can have an advantage in that grid row and column addressing lines can be maintained to read sensor information from each pixel in the array. In each quadrant of the die, for example, the row or column lines can run parallel to one of the cut lines of the die. A further advantage can be that a significant fraction of the central area can be maintained without any cut features, thus allowing the passage of electronic signal lines to all areas of the die. This can be contrasted with an alternative approach of butting several die together into a curved configuration. In this latter case, it can be difficult to create interconnects that transfer electronic signals from one die to its neighbor, thereby increasing the complexity of the sensor. In addition, in the current state of the art for this type of arrangement, it is generally not possible to precisely butt the separate sensors together closely, often resulting in relatively large gaps between adjacent sensors. Such configuration can be acceptable for astronomical uses but is generally undesirable for photographic equipment. By starting with a single sensor joined at the center, implementations described herein realize a built in alignment strategy that allows much closer joining of edge pixels.

Figure 9:
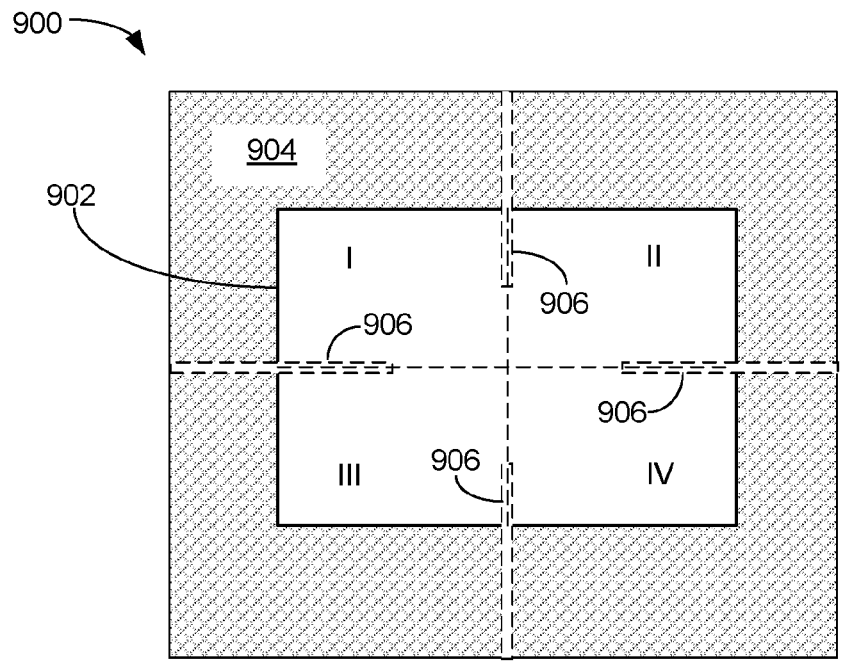

FIG. 9 is a top view of an example semiconductor die 900, which can be similar to or the same as semiconductor die 800, for example. Semiconductor die 900 includes an active region 902 and an inactive region 904. Pixels (e.g., such as pixels 604) occupy active region 902 except for areas occupied by cut lines 906 (and associated setback areas). In the particular example, of FIG. 9, the pixels in active region 902 can be electronically configured into four regions (though a configuration can have any number of regions) labelled as I, II, III, and IV.

Cut lines can be created in semiconductor die 900 by laser cutting or etching, for example. Cut lines can be processed using conventional dry etching methods. For high aspect ratio cuts, deep reactive ion etching can be used to ensure that sidewalls of the cut lines are substantially vertical (e.g., perpendicular to the surface of the substrate). Any non-verticality of the etch is desirably limited to less than one pixel width. In some examples, cut lines can be created after pixels are present in the active region. In such a fabrication order, the pixels can be masked while the cut lines are created by etching or by laser cutting. Semiconductor die 900 can have a thickness, in some particular examples, of about 25 microns.

Figure 10:
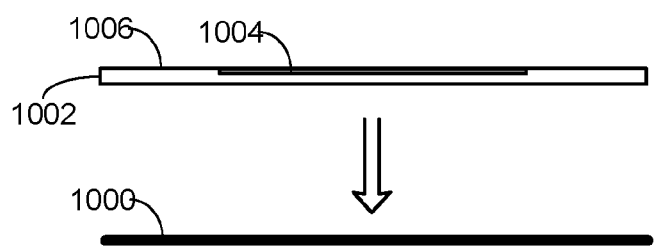
FIG. 10 illustrates a schematic representation of an example photonic sensor die.
Figure 11:
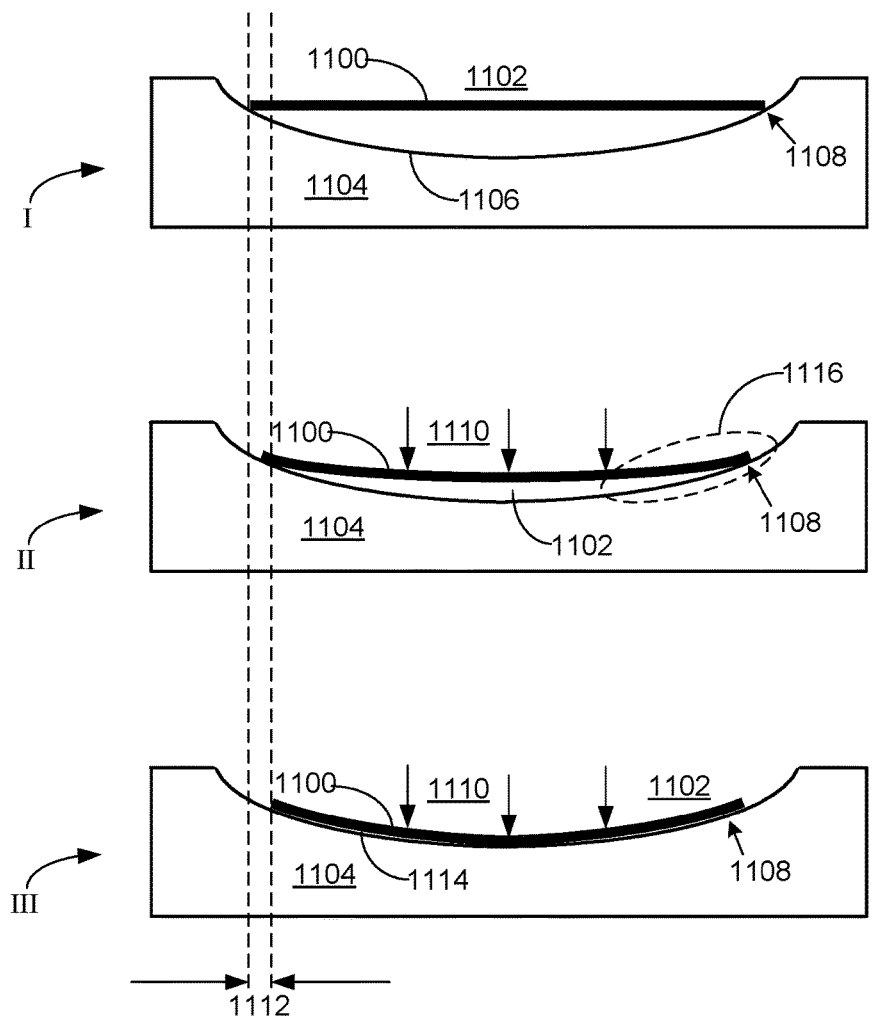
FIG. 11 includes cross-section views of an example semiconductor die in a concave mold.
Figure 12:
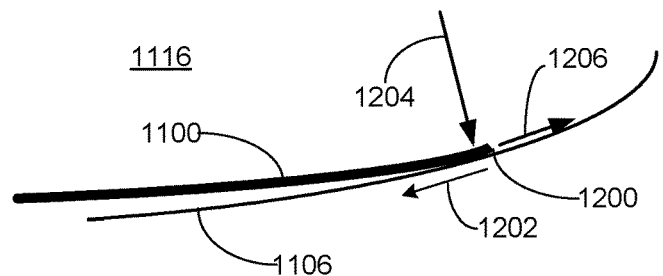
FIG. 12 is a close-up view of an edge or corner of an example semiconductor die in contact with a surface of a concave mold.
Figure 13:
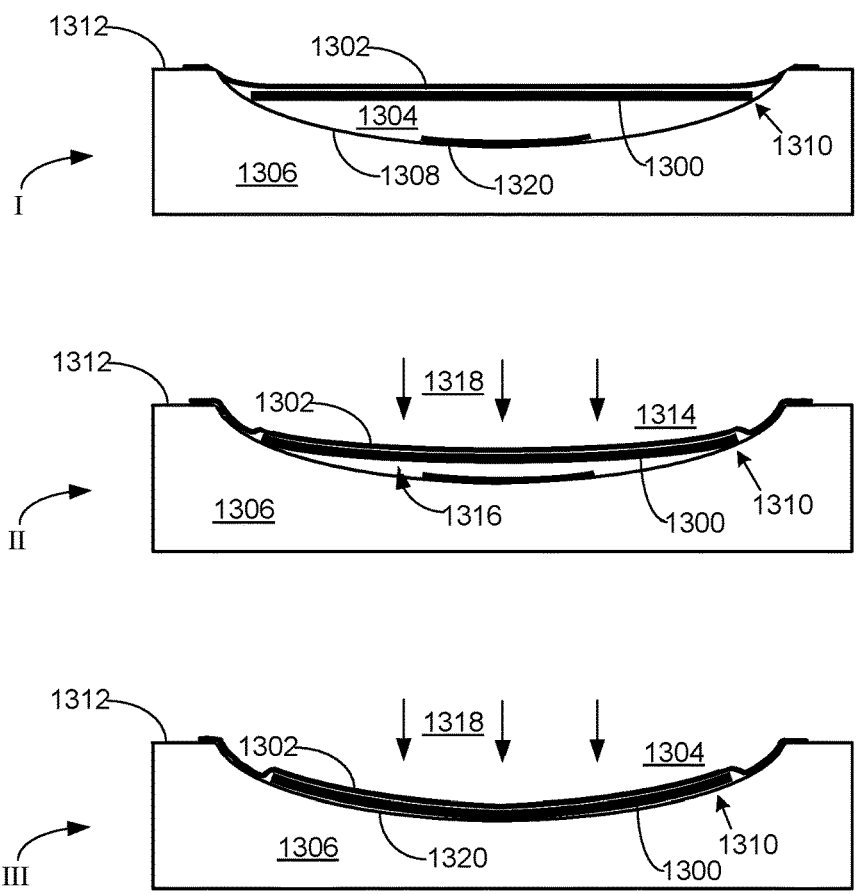
FIG. 13 includes cross-section views of an example semiconductor die and a resilient film in a concave mold.

FIG. 10 illustrates a schematic representation 1000 of an example photonic sensor die 1002 illustrated in a cross section view. For sake of clarity, FIGS. 11-13 illustrate a photonic sensor die, such as 1002, by schematic representation 1000. In other words, photonic sensor die 1002, which can include an active region 1004 and an inactive region 1006, is illustrated in FIGS. 11-13 as a thick line or curve. It should also be noted that schematic representation 1000 can represent any of a number of types of semiconductor dies, and is not limited to representing a photonic sensor die.

FIG. 11 includes cross-section views of an example semiconductor die 1100 in a recessed surface 1102 of a concave mold 1104. For example, concave mold 1104 can be the same as or similar to concave mold 302 or 402, illustrated in FIGS. 3 and 4, respectively. In stage I, semiconductor die 1100 is flat. Edges of semiconductor die 1100 are in contact with surface 1106 at contact regions 1108. Remaining portions of semiconductor die 1100 are suspended above surface 1106.

In stage II, a net force 1110 is applied to semiconductor die 1100 to bend semiconductor die 1100. Any of a number of techniques can be used to apply force 1110, some of which are described in detail below. Edges of semiconductor die 1100 remain in contact with surface 1106 at contact regions 1108, while semiconductor die 1100 bends as force 1110 is applied.

In stage III, net force 1110 continues to be applied to semiconductor die 1100 and semiconductor die is further bent until its shape is substantially the same as surface 1106 of the concave mold. Edges of semiconductor die 1100 remain in contact with surface 1106 at contact regions 1108, while semiconductor die 1100 bends as force 1110 is applied. As semiconductor die bends (e.g., from stage I to stage iii), the contact region moves and increases in area. In other words, as the semiconductor die is bent downward, its edge slides downward along surface 1106 while an increasing portion of the semiconductor die comes into contact with surface 1106 (as the semiconductor die increasingly conforms to the shape of surface 1106). In the case of a rectangular semiconductor die in a concave mold having a circular or elliptical cross section, only corners of the rectangular semiconductor die are in contact with surface 1106 up to some stage of bending, after which all the edges (between the corners) of the semiconductor die come into contact with surface 1106. This occurs as the semiconductor die increasingly conforms to the shape of surface 1106. Movement of edges of semiconductor die 1100 is indicated by displacement 1112, which compares the position of the edges in stage I with that of stage III.

In some implementations, an adhesive 1114 can be located between semiconductor die 1100 and surface 1106 to maintain the bent shape of semiconductor die 1100 so that force 1110 can be discontinued.

A region 1116 is indicated by a dashed oval. Close-up details of this region are described below.

FIG. 12 is a close-up view of region 1116 an edge or corner of semiconductor die 1100, introduced in FIG. 11. The edge or corner 1200 of semiconductor die 1100 is in contact with surface 1106 of concave mold 1104, according to a number of examples. As described above, edge 1200 slides inward and/or downward along surface 1106, as indicated by arrow 1202, while an applied force bends semiconductor die 1100 downward. The applied force leads to a reaction force (not illustrated) on semiconductor die 1100 by surface 1106 that in turn creates a normal force 1204. A friction force 1206, which results in part from a coefficient of friction between semiconductor die 1100 and surface 1106, is proportional to normal force 1204. Friction force 1206 acts tangentially opposite to the direction of sliding (e.g., indicated by arrow 1202) of edge or corner 1200. In some implementations, concomitant with increasing bending, an increasing portion of semiconductor die 1100 comes into contact with surface 1106 and friction force 1206 increases.

FIG. 13 includes cross-section views of a semiconductor die 1300 and a resilient film 1302 on a recessed surface 1304 of a concave mold 1306, according to various examples. For example, concave mold 1306 can be the same as or similar to concave mold 1104, illustrated in FIG. 11. At least some of the details of the examples of FIG. 13 are similar to or the same as those of FIG. 11, with the addition of resilient film 1302 in FIG. 13. As explained in detail below, resilient film 1302 can be used to (i) create a substantially uniform pressure on semiconductor die 1300, (ii) provide a technique for adjusting friction levels between semiconductor die 1300 and surface 1308 of recessed surface 1304, (iii) provide physical stability to the semiconductor die during bending to counter any tendency for the semiconductor die to wrinkle or buckle (e.g., to avoid a combination of compressive stress and tensile stress in a cross-section of the semiconductor die), and (iv) act as a membrane to contain an elevated pressure (e.g., such an elevated pressure can arise by creating a vacuum in a neighboring region, as described below). Resilient film 1302 can comprise any of a number of types of materials, such as biaxially-oriented polyethylene terephthalate (BoPET), Teflon, and Kapton, just to name a few examples. Qualitatively, candidate materials for resilient film 1302 can be substantially resilient without being overly rubbery or stretchy, will not bond to semiconductor die if contacted with some particular adhesives, and be able to maintain their properties at elevated temperatures, which can occur in thermal curing processes.

In stage I, semiconductor die 1300 is flat. Edges of semiconductor die 1300 are in contact with surface 1308 at contact regions 1310. Remaining portions of semiconductor die 1300 are suspended above surface 1308. Resilient film 1302 can be partially outside recessed surface 1304 and on a periphery 1312 of concave mold 1306. In this configuration, resilient film 1302 can act as a membrane to contain a pressure above resilient film 1302 that is greater than a pressure below resilient film 1302 and semiconductor die 1300. Such a situation is illustrated in stage II, wherein pressure in a volume 1314 above resilient film 1302 is greater than a pressure in a volume 1316 below resilient film 1302 and semiconductor die 1300. Such a pressure difference leads to a net pressure and force 1318 that pushes and deflects semiconductor die 1300 into recessed surface 1304 of concave mold 1306. In some examples, to create a pressure difference, volume 1314 can include ambient pressure while volume 1316 is at least a partial vacuum. In various implementations, a pressure relief port (not illustrated) can be used to remove elevated and/or reduced pressure states in volumes 1314 and 1316, for example.

An adhesive 1320, which can comprise a solder or a thermosetting epoxy, for example, can be placed on at least a portion of surface 1308. In some implementations, throughout the deflection and bending process depicted in stages I and II, semiconductor die 1300 does not contact adhesive 1320 until stage III, when semiconductor die is substantially the same shape as surface 1308 of concave mold 1306. Subsequent to that event, space between semiconductor die 1300 and surface 1308 is sufficiently small and narrow such that adhesive 1320 can wick along this space (e.g., at least partially due to capillary action of the adhesive) and substantially cover surface 1308 beneath semiconductor die 1300. Wicked adhesive 1320, which is substantially uniform, can have a thickness in a range from about 0.5 microns up to about 1.0 micron, for example. In some implementations, the surface of semiconductor die 1300 and/or surface 1308 can have a particular roughness or texture for a desired amount of wettability of adhesive 1320 on these surfaces.

Subsequent to adhesive 1320 being in contact with both semiconductor die 1300 and surface 1308, the temperature of the adhesive (and adjacent semiconductor die 1300 and surface 1308) can be raised to cure the adhesive. The pressure differential between volumes 1314 and 1316 can be maintained until the adhesive is cured. At this point, semiconductor die 1300 is adhered to surface 1308 of mold 1306. Alternatively, if the mold comprises a substantially transparent material, a light cured adhesive such as a UV adhesive, can be used to adhere the semiconductor die.

Figure 14:
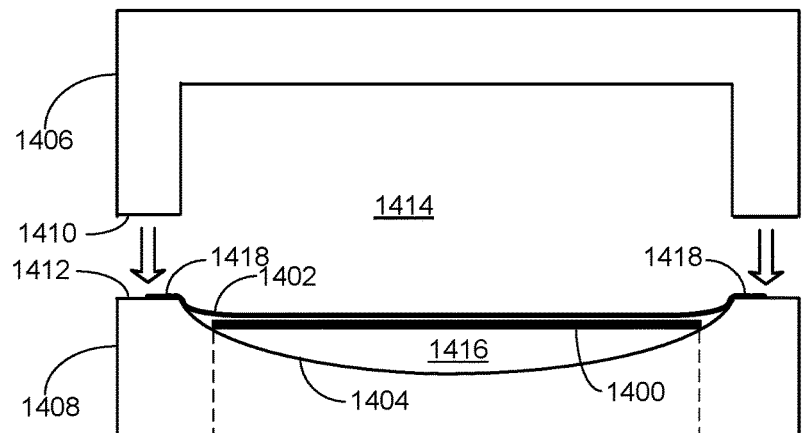
FIGS. 14-16 are cross-section views of an example semiconductor die and a resilient film in a bending jig that includes a concave mold.
Figure 15:
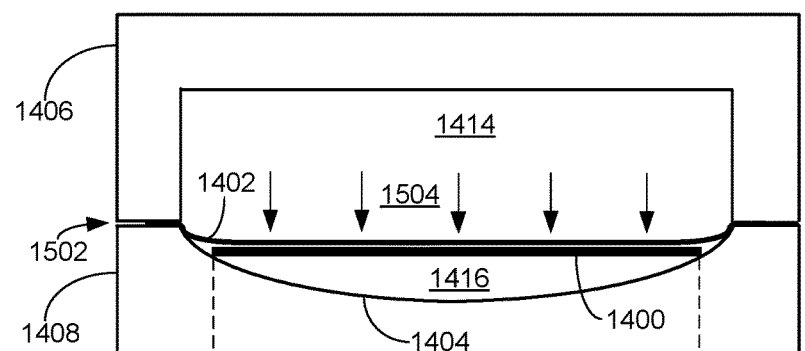
Figure 16:
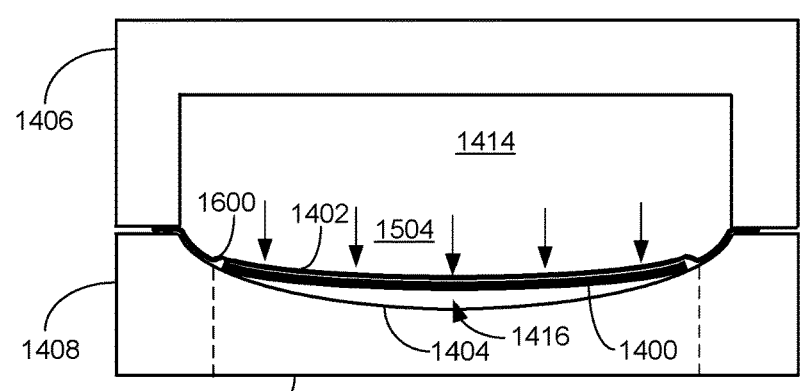

FIGS. 14-16 illustrate various portions of an example process of bending or shaping a semiconductor sensor die, such as photonic sensor die 100, according to some examples. Such a process can be performed by any entity, either manually (e.g., by human), automatically (e.g., by machine), or a combination thereof. Such an entity, which may, for example, be a manufacturer, assembler, fabricator, or builder is herein referred to as a "fabricator". Such a process can comprise batch processing, wherein a plurality (e.g., dozens, hundreds, or thousands) of semiconductor sensor dies can be shaped simultaneously.

FIG. 14 is a cross-section view of a semiconductor die 1400 and a resilient film 1402 in a bending jig that includes a concave mold surface 1404, according to various examples. For example, concave mold surface 1404 can be the same as or similar to surface 1308 of concave mold 1306, and resilient film 1402 can be the same as or similar to resilient film 1302, illustrated in FIG. 13. For illustrative clarity, a slender gap between semiconductor die 1400 and film 1402 is illustrated in FIG. 14, but such a gap does not actually exist. In other words, film 1402 and semiconductor die 1400 are in contact with one another.

The bending jig can comprise an upper portion 1406 and a lower portion 1408, which includes concave mold surface 1404. Upper portion 1406 and lower portion 1408 are configured to be joined together during a process of bending semiconductor die 1400 and can be mechanically aligned with one another by pins (not illustrated) that at least partially control vertical motion, which is indicated by the arrows in FIG. 14. In this fashion, for example, interface surface 1410 of upper portion 1406 and interface surface 1412 of lower portion 1408 can be joined (e.g., clamped) together, forming a volume 1414. In some examples, subsequent to a bending process, lower portion 1408 can be removed from the bending jig to be a permanent part of a shaped (bent) semiconductor die after being adhered to the semiconductor die.

When upper portion 1406 and lower portion 1408 are joined, volume 1414 can be pressurized to have a pressure greater than surrounding areas, as described below.

While upper portion 1406 and lower portion 1408 of the bending jig are separated, a fabricator can place an adhesive on at least a portion of concave mold surface 1404 and place semiconductor die 1400 in the recess formed by concave mold surface 1404. In the case where the semiconductor die is rectangular, the corners of the semiconductor die are the only portions of the semiconductor die in physical contact with concave mold surface 1404. In the case where the semiconductor die is circular, the edge (e.g., perimeter) of the semiconductor die is the only portion of the semiconductor die in physical contact with concave mold surface 1404. Accordingly, semiconductor die 1400 is suspended over and substantially covers the recessed surface of the concave mold, while the corners or edge(s) of the semiconductor die rest on the recessed surface. Moreover, corners or edge(s) of the semiconductor die are free to slide on concave mold surface 1404.

A fabricator can place resilient film 1402 on semiconductor die 1400 to cover the semiconductor die and at least a portion of interface surface 1412. Placement of resilient film 1402 creates a volume between resilient film 1402 (and semiconductor die 1400) and concave mold surface 1404 that is substantially closed. When upper portion 1406 and lower portion 1408 of the bending jig are joined, interface surface 1410 and interface surface 1412 clamp onto an edge region 1418 of resilient film 1402, leading to a fluid-tight seal (e.g., for a fluid, liquid, or gas).

In some examples, lower portion 1408 of the bending jig can comprise a concave mold portion 1420 that is removable from lower portion 1408. Vertical dashed lines indicate an example interface where concave mold portion 1420 can be removed from lower portion 1408. In this case, concave mold portion 1420 can become a permanent part of a shaped semiconductor die 1400 by adhering the semiconductor die and the concave mold portion together after the bending process, as described below.

In FIG. 15, the fabricator can join upper portion 1406 and lower portion 1408 of the bending jig together, tightly clamping edge region 1418 of resilient film 1402, and forming a seal 1502. Accordingly, volumes 1414 and 1416 can be pressurized (or depressurized to form at least a partial vacuum) independently of one another. The fabricator can adjust the pressures of volumes 1414 and/or 1416 so that the pressure of volume 1414 is greater than that of volume 1416. Such a pressure differential condition leads to a substantially uniform force 1504 on film 1402, and in turn, semiconductor die 1400. Force 1504 bends semiconductor die 1400 downward into the concave mold. (In various implementations, one or more pressure relief ports (not illustrated) can be used to remove elevated and/or reduced pressure states in volumes 1414 and 1416, for example.)

In FIG. 16, the fabricator maintains the pressure differential that leads to force 1504. Thus, as force 1504 continues to be applied to semiconductor die 1400, the semiconductor die is bent until its shape is substantially the same as concave mold surface 1404. Edges of semiconductor die 1400 remain in contact with concave mold surface 1404 while semiconductor die 1400 bends as force 1504 is applied. As the semiconductor die bends, the contact region between concave mold surface 1404 and the edges of semiconductor die 1400 moves and increases in area. In other words, as the semiconductor die is bent downward, its edge slides downward along surface 1404 while an increasing portion of the semiconductor die comes into contact with surface 1404 (as the semiconductor die increasingly conforms to the shape of surface 1404). This increasing contact area leads to an increasing friction force as the semiconductor die is bent into the concave mold.

In some examples, force 1504 pushes film 1402 against semiconductor die 1400 to squeeze semiconductor die 1400 between film 1402 and surface 1404. A friction coefficient between film 1402 and semiconductor die 1400 leads to a frictional force, in addition to the frictional force between semiconductor die 1400 and surface 1404. As semiconductor die 1400 bends under force 1504, the semiconductor die stores mechanical energy, leading to stresses that can fracture the semiconductor die during the bending process. For example, tension can be greatest at an apex of a bent semiconductor die. Also, bending can lead to compression in radial and circumferential directions. Tensions and compressions correspond to stresses that determine, at least in part, if the semiconductor die fractures. Also, amount and distribution of such stresses are determined, at least in part, by frictional forces that force 1504 imposes on the semiconductor die, across the area of the semiconductor die and at the edges of the semiconductor die. Depending, at least in part, on the shape and characteristics of the semiconductor die, the concave mold shape, and rate of bending of the semiconductor die, a particular range of frictional forces may be desirable to significantly reduce or minimize likelihood of semiconductor die fracture during bending. For example, such a particular range of frictional forces can provide a desirable amount of physical stability during the bending process. Absence of physical stability may, for example, lead to undesirable wrinkling or buckling of the semiconductor die. (A rectangular semiconductor die can have a tendency to wrinkle as it is pushed into a circular mold). Accordingly, the fabricator can a priori adjust the amount of frictional force by designing or selecting particular materials for (or by applying surface treatments to) film 1402.

In some implementations, the elevated pressure in volume 1414 (with respect to the pressure of volume 1416) pushes film 1402 tightly against surface 1404 at the edge or corners of semiconductor die 1400. Film 1402 conforms to the edge or corners of the semiconductor die, forming an "edge conformity" 1600, that can provide positional stability to semiconductor die 1400 during the bending process. As the bending process increasingly deflects semiconductor die 1400, edge conformity 1600 follows the edge or corners of the semiconductor die as the edge or corners slide downward on surface 1404.

In some implementations, force 1504 can be replaced by a type of non-uniform force that is applied across the area of semiconductor die 1400 by pressing on the die with a forming tool (e.g., stamp) having non-uniform density or resilience. For example, pressure on semiconductor die 1400 can be applied by a forming tool having a particular shape and comprising a material having particular compliance/rigidity such that the pressure is applied over the area of the semiconductor die in a favorably gradual and controlled manner. Applying such a forming tool can allow semiconductor die 1400 to undergo displacement corresponding to a forming-shaping process. A forming tool having a higher radius of curvature than that of surface 1404 can be pushed onto semiconductor die 1400. The center portion of the forming tool can be softer (e.g., resilient) than at the edges of the forming tool. This can allow for a relatively slow buildup of pressure applied to semiconductor die 1400 as the forming tool is pushed against (e.g., lowered onto) the semiconductor die.

Figure 17:
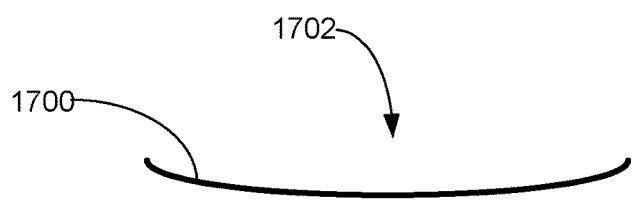
FIGS. 17 and 18 are cross-section views of example semiconductor dies.
Figure 18:
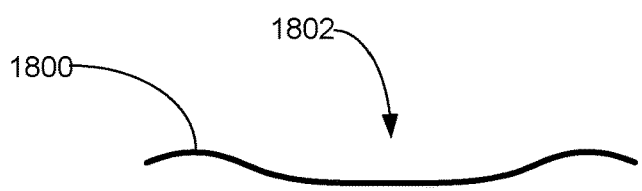

FIGS. 17 and 18 are cross-section views of curved photonic sensor dies, according to various examples. In FIG. 17, a light-sensitive portion 1700 of a curved photonic sensor die 1702 has a spherical or aspheric shape. Such a shape has no inflection points. Light-sensitive portion 1700 is concave. On the other hand, as illustrated in FIG. 18, a light-sensitive portion 1800 of a curved photonic sensor die 1802 has a complex shape that includes one or more inflection points. Portions of light-sensitive portion 1800 can include spherical or aspheric shapes. Such complex shapes can be useful in a number of optical systems. Bending processes, such as those described above, can be used to produce simple or complex shapes, such as the shapes of photonic sensor dies 1702 and 1802, for example.

Figure 19:
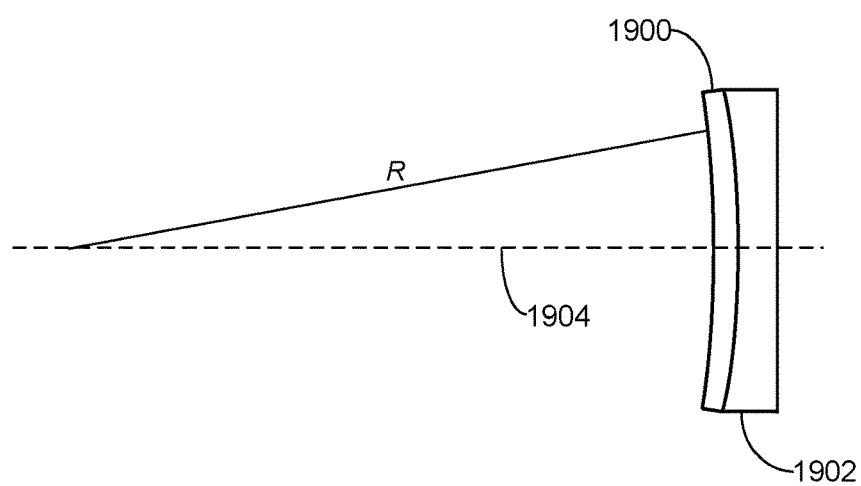
FIG. 19 is a cross-section view of an example curved photonic sensor die and a substrate.

FIG. 19 is a cross-section view of a curved photonic sensor die 1900 and a substrate 1902, according to various examples. For example, photonic sensor die 1900 can be the same as or similar to semiconductor die 1400 subsequent to a bending process described above. In some implementations, substrate 1902 can be the same as or similar to concave mold portion 1420, removed from lower portion 1408 of the bending jig illustrated in FIGS. 14-16. In other implementations, substrate 1902 can be the same as or similar to lower portion 1408 of the bending jig.

The combination of a curved photonic sensor die bonded to a substrate can comprise a stand-alone optical device that can be subsequently incorporated into optical systems. An optical axis 1904 of such optical systems is shown in relation to photonic sensor die 1900. A focal length of photonic sensor die 1900, which is based, at least in part, on the curved shape of photonic sensor die 1900, can be a significant factor when photonic sensor die 1900 is incorporated in an optical system. When the shape of photonic sensor die 1900 is substantially spherical, the focal length of photonic sensor die 1900 can be at least approximately equal to the inverse of the radius of curvature R of photonic sensor die 1900. If photonic sensor die 1900 has an aspheric shape, then the radius of curvature of photonic sensor die 1900 changes with distance from optical axis 1904. An optical system that incorporates photonic sensor die 1900 can be designed to accommodate such a variable radius of curvature.

Figure 20:
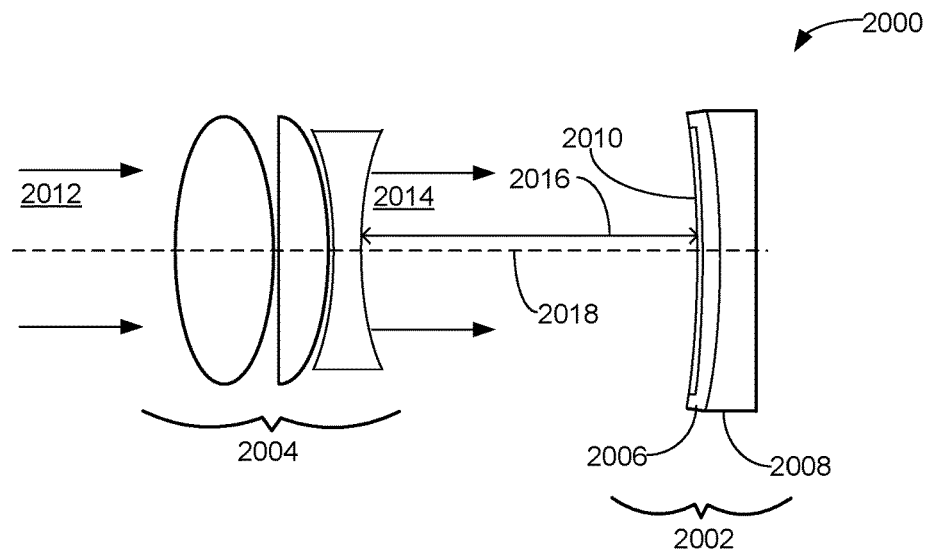
FIG. 20 is a cross-section view of an example optical system that includes a curved photonic sensor die and a substrate.

FIG. 20 is a cross-section view of an optical system 2000 that includes a curved photonic sensor module 2002 and a lens assembly 2004, according to various examples. In particular, photonic sensor module 2002 comprises a curved photonic sensor die 2006 and a substrate 2008. Curved photonic sensor die 2006 includes a light-sensitive portion 2010. Curved photonic sensor die 2006 and substrate 2008 can be similar to or the same as curved semiconductor die 1400 and lower portion 1408 illustrated in FIG. 14, respectively. In some implementations, substrate 2008 can be sufficiently rigid to maintain the curved shape of curved photonic sensor die 2006.

Curved photonic sensor die 2006 (or light-sensitive portion 2010) can have a shape that gives rise to a focal length. (In some examples, a "Petzval" field curvature of a lens of optical system 2000 may match the curvature of the photonic sensor die 2006 (or light-sensitive portion 2010). Such a focal length can be considered when placing photonic sensor module 2002 in optical system 2000. In particular, lens assembly 2004 can be designed to receive light 2012, optically operate on the light, and produce light output 2014 that focuses an image onto curved photonic sensor die 2006, which can be a distance 2016 from lens assembly 2004. Distance 2016 can be at least approximately equal to a focal length of curved photonic sensor die 2006. In some implementations, an inverse of the focal length of curved photonic sensor die 2006 is at least approximately equal to the radius of curvature of curved photonic sensor die 2006. Lens assembly 2004 and photonic sensor module 2002 can be aligned along an optical axis 2018.

Figure 21:
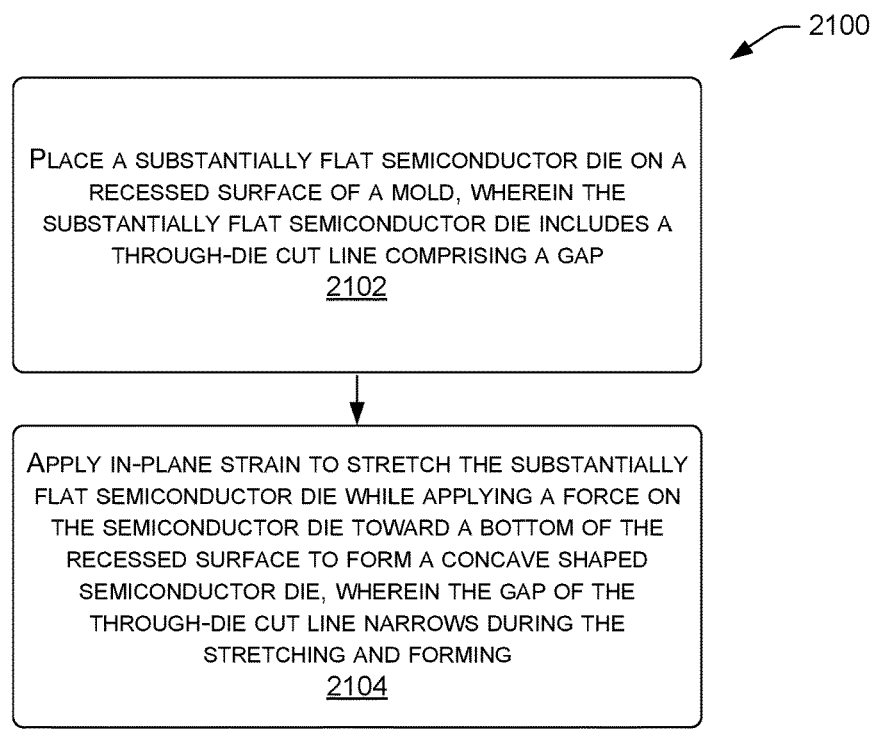
FIG. 21 is a flow diagram illustrating example processes for bending a semiconductor die.

FIG. 21 is a flow diagram illustrating a process 2100 for bending a semiconductor die, according to some examples. For example, such a semiconductor die can be the same as or similar to photonic sensor die 1400 shown in FIG. 14. Process 2100 can be similar to or the same as at least a portion of the process depicted in FIGS. 14-16 and can be performed by a fabricator. A fabricator can provide a concave mold (e.g., or at least partially concave) to use in process 2100. Such a mold can include a recessed surface and a bottom of the recessed surface. For example, in the case of the mold being spherical and the recessed surface having the shape of a hemisphere, the bottom of the recessed surface is the apex of the hemisphere.

At block 2102, the fabricator can place a substantially flat semiconductor die on a recessed surface of a mold, where the substantially flat semiconductor die includes a through-die cut line comprising a gap. For example, in the case where the semiconductor die is rectangular and the recessed surface has a circular or elliptical cross section, the corners of the semiconductor die are the only portions of the semiconductor die in physical contact with the mold. In the case where the semiconductor die is circular and the recessed surface has a circular cross section, the edge (e.g., perimeter) of the semiconductor die is the only portion of the semiconductor die in physical contact with the mold. In some implementations, the semiconductor die comprises a photonic sensor die.

At block 2104, the fabricator can apply in-plane strain to stretch the substantially flat semiconductor die while applying a force on the semiconductor die toward a bottom of the recessed surface to form a concave shaped semiconductor die, where the gap of the through-die cut line narrows during the stretching and forming. In some implementations, the force on the semiconductor die is applied substantially uniformly across the area of the semiconductor die. During such bending, the edges of the semiconductor die move or slide relative to the recessed surface.

Example Clauses

A. A method comprising: placing a substantially flat semiconductor die on a recessed surface of a mold, wherein the substantially flat semiconductor die includes a through-die cut line comprising a gap; and applying in-plane strain to stretch the substantially flat semiconductor die while applying a force on the semiconductor die toward a bottom of the recessed surface to form a concave shaped semiconductor die, wherein the gap of the through-die cut line narrows during the stretching and forming.

B. The method as claim A recites, further comprising: prior to the stretching, placing a resilient film to cover (i) the substantially flat semiconductor die and (ii) the recessed surface of the mold, wherein the resilient film is substantially fluid-impermeable.

C. The method as claim A recites, further comprising: prior to stretching and forming the substantially flat semiconductor die, placing an adhesive on the bottom of the recessed surface, wherein the semiconductor die is not in contact with the adhesive until the semiconductor die has a shape that substantially corresponds to the shape of the recessed surface of the mold.

D. The method as claim A recites, wherein the semiconductor die comprises a photonic sensor die.

E. The method as claim A recites, wherein the force on the semiconductor die is substantially uniform across the area of the semiconductor die.

F. The method as claim A recites, wherein the semiconductor die includes light-sensitive pixels on both sides of the gap, and wherein a distance between the light-sensitive pixels decreases during the stretching and forming.

G. The method as claim A recites, wherein applying the in-plane strain to stretch the substantially flat semiconductor die comprises maintaining tensile stress through an entire thickness of the semiconductor die.

H. The method as claim A recites, wherein applying the in-plane strain to stretch the substantially flat semiconductor die comprises avoiding a combination of compressive stress and tensile stress in a cross-section of the semiconductor die.

I. The method as claim A recites, wherein the semiconductor die includes an array of pixels and circuitry for applying row-column addressing to the array of pixels, and wherein the method further comprises: applying the in-plane strain to stretch the array of pixels and the circuitry.

J. The method as claim A recites, wherein the through-die cut line partitions the array of pixels and the circuitry.

K. A concave semiconductor die comprising: an array of light-sensitive pixels; one or more through-die cut lines partitioning the array of light-sensitive pixels, wherein the one or more through-die cut lines extend inward from an edge of the concave semiconductor die; and circuitry extending from the edge of the concave semiconductor die, wherein the circuitry is configured to provide row-column addressing for the array of light-sensitive pixels.

L. The concave semiconductor die as claim J recites, wherein the one or more through-die cut lines include a stress concentration relief profile at a terminus of the through-die cut line.

M. The concave semiconductor die as claim J recites, wherein rows or columns of the light-sensitive pixels of the array are spaced apart by a first distance, and wherein the one or more through-die cut lines have a width less than about ten times the first distance.

N. The concave semiconductor die as claim J recites, wherein the semiconductor die comprises a photonic sensor die.

O. A method comprising: receiving electronic signals from pixels included in a substantially curved semiconductor die in an optical system, wherein the substantially curved semiconductor die includes the pixels and a through-die cut line; and processing the electronic signals to form an image, wherein the processing includes interpolating signals from the pixels that are adjacent to the through-die cut line.

P. The method as claim O recites, wherein the pixels are partitioned into two or more groups, and each of the groups has data lines that are separated from data lines of the other groups by the through-die cut line.

Q. The method as claim P recites, further comprising: applying row-column addressing separately to the two or more groups of pixels.

R. The method as claim P recites, wherein the data lines include first data lines for row-column addressing a first group of the pixels and second data lines for row-column addressing a second group of the pixels, and wherein the first data lines are separated from the second data lines by the through-cut die line and the first group of pixels are separated from the second group of pixels by the through-cut die line.

S. The method as claim O recites, wherein the substantially curved semiconductor die in the optical system is configured to function as a lens in combination with a photo-sensor.

T. The method as claim O recites, wherein the semiconductor die comprises a photonic sensor die and the pixels comprise light-sensitive pixels.

CONCLUSION

Although the subject matter has been described in language specific to structural features and/or methodological acts, it is to be understood that the subject matter defined in the appended claims is not necessarily limited to the specific features or acts described. Rather, the specific features and steps are disclosed as example forms of implementing the claims.

All of the methods and processes described above can be embodied in, and fully automated via, software code modules executed by one or more general purpose computers or processors. The code modules can be stored in any type of computer-readable medium, computer storage medium, or other computer storage device. Some or all of the methods can alternatively be embodied in specialized computer hardware such as, for example, a quantum computer or quantum annealer.

Conditional language such as, among others, "can," "could," "may" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. can be either X, Y, or Z, or a combination thereof.

Any routine descriptions, elements or blocks in the flow diagrams described herein and/or depicted in the attached figures should be understood as potentially representing modules, segments, or portions of code that include one or more executable instructions for implementing specific logical functions or elements in the routine. Alternate implementations are included within the scope of the examples described herein in which elements or functions can be deleted, or executed out of order from that shown or discussed, including substantially synchronously or in reverse order, depending on the functionality involved as would be understood by those skilled in the art.

It should be emphasized that many variations and modifications can be made to the above-described examples, the elements of which are to be understood as being among other acceptable examples. All such modifications and variations are intended to be included herein within the scope of this disclosure and protected by the following claims.

What is claimed is:

1. A method comprising:
   placing a substantially flat semiconductor die on a recessed surface of a mold, wherein the substantially flat semiconductor die includes a through-die cut line comprising a gap; and
   applying in-plane strain to stretch the substantially flat semiconductor die while applying a force on the semiconductor die toward a bottom of the recessed surface to form a concave shaped semiconductor die, wherein the gap of the through-die cut line narrows during the stretching and forming,
   wherein the substantially flat semiconductor die includes light-sensitive pixels on both sides of the gap, and wherein the light-sensitive pixels are partitioned into two or more groups, and each of the groups has data lines that are separated from data lines of the other groups by the through-die cut line.

2. The method of claim 1, further comprising:
   prior to the stretching, placing a resilient film to cover (i) the substantially flat semiconductor die and (ii) the recessed surface of the mold, wherein the resilient film is substantially fluid-impermeable.

3. The method of claim 1, further comprising:
   prior to stretching and forming the substantially flat semiconductor die, placing an adhesive on the bottom of the recessed surface, wherein the semiconductor die is not in contact with the adhesive until the semiconductor die has a shape that substantially corresponds to the shape of the recessed surface of the mold.

4. The method of claim 1, wherein the semiconductor die comprises a photonic sensor die.

5. The method of claim 1, wherein the force on the semiconductor die is substantially uniform across the area of the semiconductor die.

6. The method of claim 1, wherein a distance between the light-sensitive pixels decreases during the stretching and forming.

7. The method of claim 1, wherein applying the in-plane strain to stretch the substantially flat semiconductor die comprises maintaining tensile stress through an entire thickness of the semiconductor die.

8. The method of claim 1, wherein applying the in-plane strain to stretch the substantially flat semiconductor die comprises avoiding a combination of compressive stress and tensile stress in a cross-section of the semiconductor die.

9. The method of claim 1, wherein the semiconductor die includes an array of the light-sensitive pixels and circuitry for applying row-column addressing to the array of the light-sensitive pixels, and wherein the method further comprises:
   applying the in-plane strain to stretch the array of pixels and the circuitry.

10. The method of claim 9, wherein the through-die cut line partitions the array of the light-sensitive pixels and the circuitry.

11. A concave semiconductor die comprising:
    an array of light-sensitive pixels;

one or more through-die cut lines partitioning the array of light-sensitive pixels, wherein the one or more through-die cut lines extend inward from an edge of the concave semiconductor die, wherein the light-sensitive pixels are partitioned into two or more groups, and each of the groups has data lines that are separated from data lines of the other groups by the one or more through-die cut lines; and circuitry extending from the edge of the concave semiconductor die, wherein the circuitry is configured to provide row-column addressing for the array of light-sensitive pixels.

12. The concave semiconductor die of claim 11, wherein the one or more through-die cut lines include a stress concentration relief profile at a terminus of the through-die cut line.

13. The concave semiconductor die of claim 11, wherein rows or columns of the light-sensitive pixels of the array are spaced apart by a first distance, and wherein the one or more through-die cut lines have a width less than about ten times the first distance.

14. The concave semiconductor die of claim 11, wherein the semiconductor die comprises a photonic sensor die.

15. A method comprising:

receiving electronic signals from pixels included in a substantially curved semiconductor die in an optical system, wherein the substantially curved semiconductor die includes the pixels and a through-die cut line, wherein the pixels are partitioned into two or more groups, and each of the groups has data lines that are separated from data lines of the other groups by the through-die cut line; and processing the electronic signals to form an image, wherein the processing includes interpolating signals from the pixels that are adjacent to the through-die cut line.

16. The method of claim 15, wherein the pixels are partitioned into four or more groups, and each of the groups has data lines that are separated from data lines of the other groups by the through-die cut line.

17. The method of claim 15, further comprising:

applying row-column addressing separately to the two or more groups of pixels.

18. The method of claim 15, wherein the data lines include first data lines for row-column addressing a first group of the pixels and second data lines for row-column addressing a second group of the pixels, and wherein the first data lines are separated from the second data lines by the through-cut die line and the first group of pixels are separated from the second group of pixels by the through-cut die line.

19. The method of claim 15, wherein the substantially curved semiconductor die in the optical system is configured to function as a lens in combination with a photo-sensor.

20. The method of claim 15, wherein the semiconductor die comprises a photonic sensor die and the pixels comprise light-sensitive pixels.

* * * * *